US010211832B1

(12) United States Patent
Matsuno et al.

(10) Patent No.: US 10,211,832 B1
(45) Date of Patent: Feb. 19, 2019

(54) INPUT BUFFER CIRCUIT

(71) Applicant: MICRON TECHNOLOGY, INC., Boise, ID (US)

(72) Inventors: Hiroyuki Matsuno, Tama (JP); Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/832,431

(22) Filed: Dec. 5, 2017

(51) Int. Cl.
| H03K 19/00 | (2006.01) |
| G11C 5/14 | (2006.01) |
| G11C 7/10 | (2006.01) |
| G11C 7/22 | (2006.01) |
| G11C 14/00 | (2006.01) |
| H03K 19/0185 | (2006.01) |
| G11C 8/10 | (2006.01) |

(52) U.S. Cl.
CPC ......... *H03K 19/0013* (2013.01); *G11C 5/147* (2013.01); *G11C 7/10* (2013.01); *G11C 7/222* (2013.01); *G11C 8/10* (2013.01); *G11C 14/0054* (2013.01); *H03K 19/0185* (2013.01)

(58) Field of Classification Search
CPC ........... H03K 19/0013; H03K 19/0185; G11C 5/147; G11C 7/10; G11C 7/222; G11C 8/10; G11C 14/0054
See application file for complete search history.

(56) References Cited

U.S. PATENT DOCUMENTS

| 6,225,863 | B1* | 5/2001 | Miwa | H03F 3/45183 |
| | | | | 327/307 |
| 7,288,967 | B2* | 10/2007 | Byun | H03F 3/211 |
| | | | | 326/68 |
| 7,382,661 | B1* | 6/2008 | Lin | G11C 16/10 |
| | | | | 365/185.19 |
| 7,557,602 | B2* | 7/2009 | Kim | H03K 6/04 |
| | | | | 326/26 |
| 8,610,462 | B1* | 12/2013 | Wang | H03K 3/356113 |
| | | | | 326/68 |
| 2012/0194222 | A1* | 8/2012 | Hoefler | G11C 7/04 |
| | | | | 327/57 |
| 2015/0016205 | A1* | 1/2015 | Kohno | H03F 3/45183 |
| | | | | 365/226 |

* cited by examiner

*Primary Examiner* — Dylan C White
(74) *Attorney, Agent, or Firm* — Dorsey & Whitney LLP

(57) ABSTRACT

An example apparatus according to an embodiment of the disclosure includes first and second voltage terminals, and first, second, and third circuit nodes. A potential of the first circuit node is changed based on an input signal. A flip-flop circuit includes first and second inverters cross-coupled to each other. The first inverter is coupled between the first voltage terminal and the second circuit node. A first transistor is coupled between the second and third circuit nodes, and the first transistor has a control electrode coupled to the first circuit node. A first current control circuit is coupled between the third circuit node and the second voltage terminal, and an amount of current flowing through the first current control circuit being controlled based on a first code signal.

22 Claims, 7 Drawing Sheets

| CODE | |
|---|---|
| CODE0T | 11111 |
| CODE0B | 11011 |
| CODE1T | 11111 |
| CODE1B | 11110 |
| CODE2T | 10100 |
| CODE2B | 11111 |
| ⋮ | ⋮ |
| CODEnT | 11110 |
| CODEnB | 11111 |

FIG. 5

INPUT BUFFER CIRCUIT

BACKGROUND

High data reliability, high speed of memory access, and reduced chip size are features that are demanded from semiconductor memory.

In recent years, there has been an effort to increase access speed while reducing power consumption for semiconductor devices. As part of that effort to increase access speed, it may be desirable to include input receiver circuits having faster operation in input buffers for receiving address signals, command signals and clock signals. Simultaneously, it may be desirable to accommodate a wide range of input signals at the input receiver circuits to meet recent semiconductor devices (e.g., low-power double data rate synchronous DRAM). For example, Low Power Double Data Rate 4 (LPDDR4) specification (JESD209-4) specifies that a data input reference voltage (VREF) operating point range from 10 % to 42 % of a power supply voltage for data input (VDD). Along these lines, an input receiver circuit including differential amplifiers have been developed. For example, a data latch type input buffer has been used as an input buffer for memory devices (e.g., LPDDR4). A data latch type input (DQ) buffer in a memory device amplifies a data signal and latches the data signal by amplifying a voltage difference between the data input signal and the VREF when a clock signal CLK is at a logic high level, and initializes each node in the DQ buffer by precharging each node when the clock signal CLK is at a logic low level. The DQ input buffer performs a sequence of amplification and latch operation responsive to a signal input and a precharge operation in turn during each clock cycle. Source nodes of input transistors may receive a power supply voltage VDD and gate nodes of the input transistors coupled to input nodes (IN+ node and IN− node) may receive a data input signal DQ and the reference voltage VREF, respectively while performing the sequence of amplification and latch operation. However, the input transistors may not be driven fast enough due to a smaller VGS of the input transistors M1 and M2, if a voltage of the data input signal DQ and the reference voltage VREF become higher (e.g., VREF=42%*VDD).

FIG. 1 is a circuit diagram of a conventional input buffer circuit. The conventional data input buffer circuit includes a first amplifier including transistors M1, M2, M3, M4, M5 and M6. A transistor M0 is a switch of the first amplifier. A data input signal DQ is provided to an IN+ node coupled to a gate of the transistor M1. The reference voltage VREF is provided to an IN− node coupled to a gate of the transistor M2. A sequence of amplification and latch operation are executed, when an inverted clock signal CLKB is at a logic low level that activates transistor M0 and deactivates transistors M7-M10. The power supply voltage VDD is provided to nodes, (node1 and node2) through transistors M1 and M2 and voltages of the nodes (node1 and node2) are increased from a precharge level VSS responsive to the inverted clock signal CLKB is at the logic low level, depending on the data input signal DQ. Thus, a voltage difference Vdiff between the nodes (node1 and node2) may be caused based on a difference between a voltage of the input data input signal DQ and the reference voltage VREF. Because the power supply voltage VDD is provided to nodes (node1 and node2), voltages at an OUT− node and an OUT+ node may be increased from the precharge level VSS through transistors M3 and M4 respectively, when the voltage difference Vdiff exceeds a threshold voltage VTh of the transistor M3 or a threshold voltage VTh of the transistor M4. Due to voltages of the node1 and the node2 that are increased up to approximately the power supply voltage VDD, the first amplifier latches a voltage difference between the OUT− node and the OUT+ node of the first amplifier, and a logic high level signal (VDD) is provided to one of the OUT− node and the OUT+ node and a logic low level signal (VSS) is provided to the other of the OUT− node and the OUT+ node. In a precharge operation, when the inverted clock signal CLKB is at a logic high level, the nodes node1, node2, OUT− and OUT+ are precharged by precharge transistors M7, M8, M9 and M10 to a logic low level signal (VSS). An increase of the voltage of the node1 above the threshold VTh of the transistor M3 drives capacitors (not shown) related to the transistor M1 and capacitors coupled to the OUT− node, (e.g., capacitors at gates of the transistors M4 and M6, a channel capacitor of the transistor M3 and a drain capacitor of the transistor M5), and a total capacitance of these capacitors is remarkably large. Similarly, a total capacitance of capacitors related to the transistor M2 is large. Accordingly, a time to increase voltages of the nodes (node1 and node2) around the power supply voltage VDD and to complete the sequence of amplification and latch operation to increase voltages at an OUT− node and an OUT+ node is longer when the data input signal DQ and the reference voltage VREF are higher, and the sequence of amplification and latch operation may not be completed by a precharge operation in the data input buffer circuit.

Besides, the data input buffer circuit of FIG. 1 has a problem that an input offset occurs due to mismatch between threshold voltages of paired transistors. For example, when a difference between a threshold voltage of the transistor M1 and a threshold voltage of the transistor M2 is caused by process variation, an operating point of the IN+ node is deviated from the reference voltage VREF. Also, when there is a difference between the threshold voltage of the transistor M3 and the threshold voltage of the transistor M4 or when there is a difference between a threshold voltage of the transistor M5 and a threshold voltage of the transistor M6, an input offset similarly occurs.

FIG. 2 is a circuit diagram of another conventional data input buffer circuit. The data input buffer circuit shown in FIG. 2 includes transistors $M11_0$ to $M11_m$ connected in parallel to the transistor M1, and transistors $M12_0$ to $M12_m$ connected in series to the transistors $M11_0$ to $M11_m$, respectively. Gate electrodes of the transistors M1 and $M11_0$ to $M11_m$ are connected to the IN+ node in common. Corresponding bits of a first code signal CODE1 are provided to gate electrodes of the transistors $M12_0$ to $M12_m$, respectively. Similarly, the data input buffer circuit shown in FIG. 2 includes transistors $M13_0$ to $M13_m$ connected in parallel to the transistor M2, and transistors $M14_0$ to $M14_m$ connected in series to the transistors $M13_0$ to $M13_m$, respectively. Gate electrodes of the transistors M2 and $M13_0$ to $M13_m$ are connected to the IN− node in common. Corresponding bits of a second code signal CODE2 are provided to gate electrodes of the transistors to $M14_0$ to $M14_m$, respectively. Accordingly, the capability of a transistor circuit MC1 can be adjusted based on a value of the code signal CODE1 and the capability of a transistor circuit MC2 can be adjusted based on a value of the code signal CODE2. Therefore, even when the threshold voltage of the transistor M1 and the threshold voltage of the transistor M2 mismatch with each other, an input offset caused by the mismatch can be cancelled.

The data input buffer circuit shown in FIG. 2 includes a flip-flop circuit including transistors M14, M15, M16, and M17. A transistor M26 is connected between a source of the transistor M16 and a VSS terminal. A gate electrode of the transistor M26 is connected to the node1. A transistor M27 is connected between a source of the transistor M17 and the VSS terminal. A gate electrode of the transistor M27 is connected to the node2. Accordingly, capacitance components of the node1 and the node2 are reduced relative to those in the data input buffer circuit shown in FIG. 1 and a faster operation can be realized. Transistors M28 and M29 are connected to the OUT+ node and the OUT− node, respectively, and the OUT+ node and the OUT− node are both precharged to a VDD level when the clock signal CLK is at a low level.

However, in the data input buffer circuit shown in FIG. 2, channel capacitors of the transistors $M11_0$ to $M11_m$ and $M12_0$ to $M12_m$ are added to the node1 and channel capacitors of the transistors $M13_0$ to $M13_m$ and $M14_0$ to $M14_m$ are added to the node2. These channel capacitors interrupt a much faster operation.

BRIEF DESCRIPTION OF THE DRAWINGS

FIG. 5 is an example of a table indicating a code signal stored in the fuse circuit.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 3:
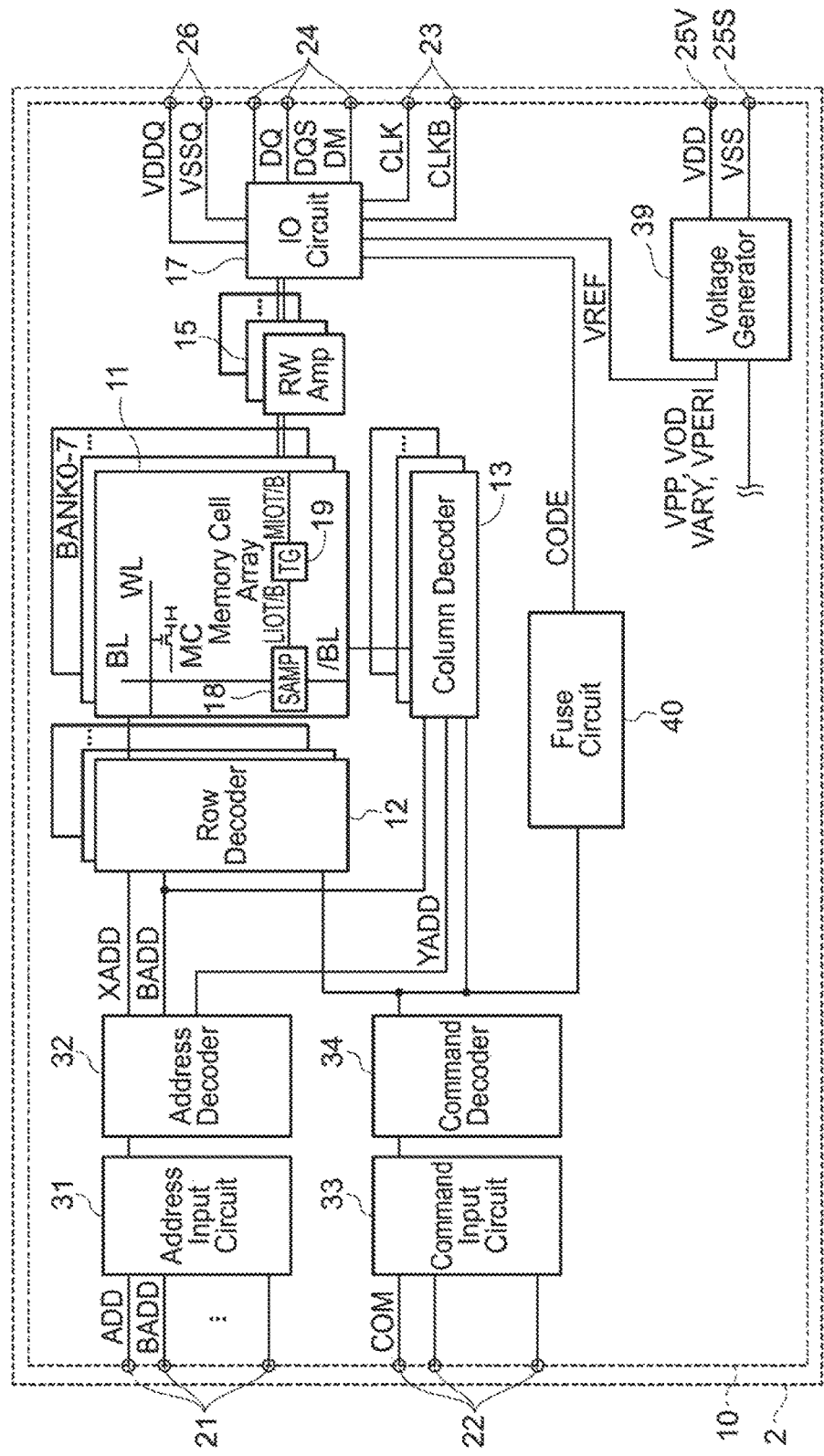
FIG. 3 is a block diagram of a semiconductor device in accordance with the present disclosure.

FIG. 3 is a block diagram of a semiconductor device in accordance with an embodiment of the present disclosure. The semiconductor device 10 may be an LPDDR4 SDRAM integrated into a single semiconductor chip, for example. The semiconductor device 10 may be mounted on an external substrate 2 that is a memory module substrate, a mother board or the like. As shown in FIG. 3, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL as performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24 and power supply terminals 25V, 25S and 26. The data terminals 24 may be coupled to output buffers for read operations of memories. Alternatively, the data terminals 24 may be coupled to input buffers for read/write access of the memories that will be later described. FIG. 3 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13. The command terminals 22 are supplied with a command signal COM. The command signal COM may include one or more separate signals. The command signal COM input to the command terminals 22 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input/output circuit 17 may include input buffers, according to one embodiment. The clock terminals 23 are supplied with external clock signals CLK and CLKB, respectively. These external clock signals CLK and CLKB are complementary to each other and are supplied to the input/output circuit 17. The input/output circuit 17 receives the external dock signals CLK and CLKB that are used as a timing signal for determining input timing of write data DQ and output timing of read data DQ.

The power supply terminals 25V and 25S are supplied with power supply potentials VDD and VSS, respectively. These power supply potentials VDD and VSS are supplied to a voltage generator 39. The voltage generator 39 may generate various internal potentials VREF, VPP, VOD, VARY, VPERI, and the like based on the power supply potentials VDD and VSS. The internal potential VPP may be mainly used in the row decoder 12, the internal potentials VOD and VARY may be mainly used in the sense amplifiers 18 included in the memory cell array 11, and the internal potential VPERI may be used in many other circuit blocks. The reference voltage VREF is supplied to the input/output circuit 17.

Power supply potentials VDDQ and VSSQ are supplied to the input/output circuit 17. The power supply potentials VDDQ and VSSQ may be the same potentials as the power supply potentials VDD and VSS that are supplied to the power supply terminals 25V and 25S, respectively. However, the dedicated power supply potentials VDDQ and VSSQ may be used for the input/output circuit 17 so that power supply noise generated by the input/output circuit 17 does not propagate to the other circuit blocks.

The semiconductor device 10 further includes a fuse circuit 40. A code signal CODE is stored in the fuse circuit 40 in a non-volatile manner. When the semiconductor device 10 is powered on, the code signal CODE stored in the fuse circuit 40 is read and transferred to the input/output circuit 17.

Figure 4:
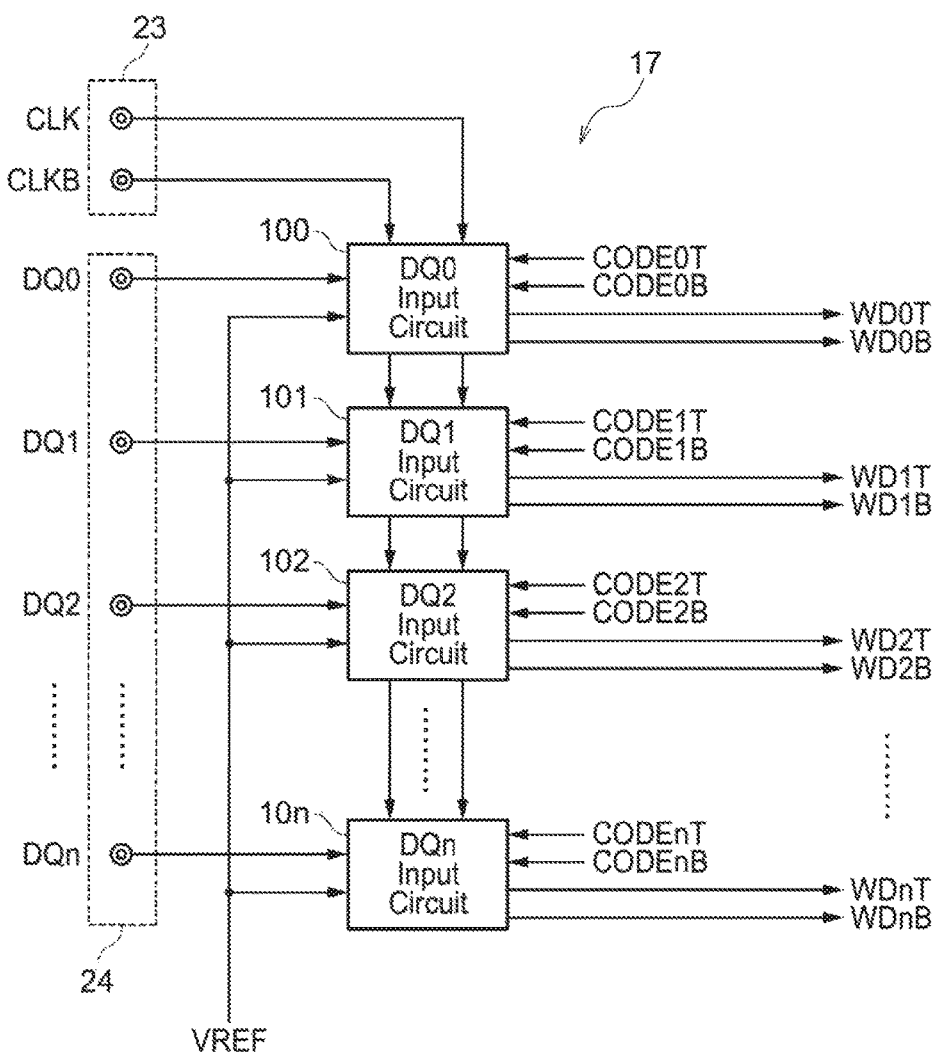
FIG. 4 is a schematic diagram showing a part of an input/output circuit in accordance with an embodiment of the present disclosure.

As shown in FIG. 4, the input/output circuit 17 includes a DQ0 input circuit 100 to a DQn input circuit 10n connected to the data terminals 24, respectively. Accordingly, write data DQ0 to DQn supplied from outside are input in parallel to the DQ0 input circuit 100 to the DQn input circuit 10n, respectively. The DQ0 input circuit 100 to the DQn input circuit 10n amplify and latch the corresponding write data DQ0 to DQn to generate complementary internal write data WD0T/B to WDnT/B, respectively. The internal write data WD0T/B to WDnT/B is supplied to the memory cell array 11 via the read/write amplifier 15 shown in FIG. 3. The external clock signals CLK and CLKB and the reference voltage VREF are supplied in common to the DQ0 input circuit 100 to the DQn input circuit 10n. Code signals CODE0T/B to CODEnT/B included in the code signal CODE are also supplied to the DQ0 input circuit 100 to the DQn input circuit 10n, respectively. As shown in FIG. 5, the code signals CODE0T/B to CODEnT/B are plural-bit signals, respectively While FIG. 5 shows an example in which the code signals CODE0T/B to CODEnT/B have a 5-bit configuration, the number of bits in the code signals CODE0T/B to CODEnT/B is not limited thereto, In the present embodiment, at least one of two code signals (CODE0T and CODE0B, for example) supplied to the same input circuit has a maximum value (11111).

Figure 6:
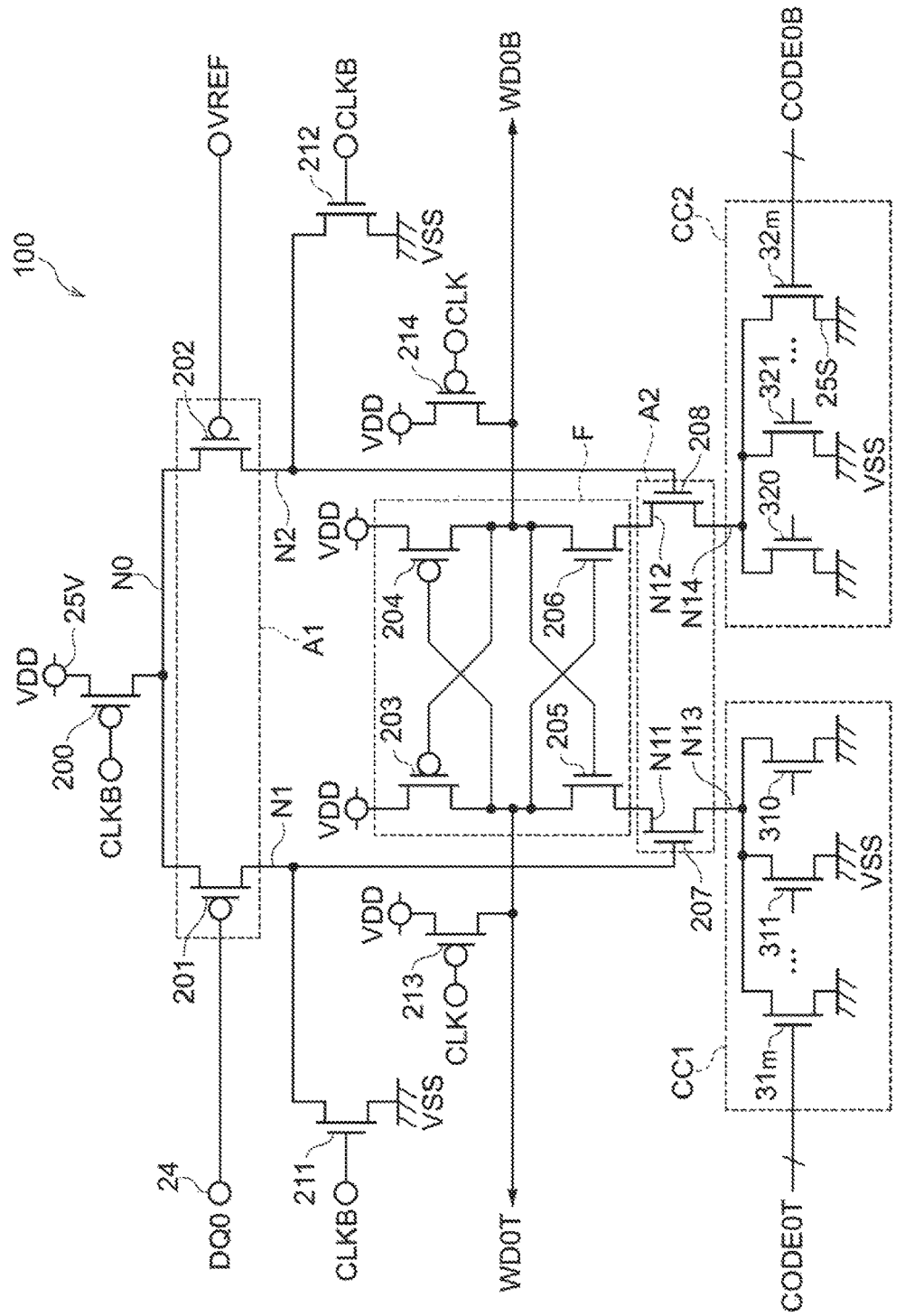
FIG. 6 is a circuit diagram of an input buffer circuit according to an embodiment of the present disclosure.

Because the DQ0 input circuit 100 to the DQn input circuit 10n have the same circuit configuration, the circuit configuration of the DQ0 input circuit 100 is described representatively. As shown in FIG. 6, the DQ0 input circuit 100 includes P-channel MOS transistors 200 to 204, 213, and 214, N-channel MOS transistors 205 to 208, 211, and 212, and current control circuits CC1 and CC2. The transistor 200 is connected between the power supply terminal 25V supplied with the power supply voltage VDD and a circuit node N0. The inverted clock signal. CLKB is supplied to the gate electrode of the transistor 200. The transistor 201 is connected between the circuit node N0 and a circuit node N1. The external write data DQ0 is supplied to the gate electrode of the transistor 201 through the data terminals 24. The transistor 202 is connected between the circuit node N0 and a circuit node N2. The reference voltage VREF is supplied to the gate electrode of the transistor 202. The transistors 201 and 202 constitute a first amplifier circuit A1 that controls the amount of current flowing through the circuit nodes N1 and N2 based on a potential difference between the reference voltage VREF and the external write data DQ0. The fast amplifier circuit A1 is activated when the inverted clock signal CLKB is brought into a low level. The transistor 211 is connected between the circuit node N1 and the power supply terminal 25S supplied with the ground potential VSS. The transistor 212 is connected between the circuit node N2 and the power supply terminal 25S supplied with the ground potential VSS. The inverted clock signal CLKB is input to the gate electrode of the transistor 211 and the gate electrode of the transistor 212. Accordingly, when the inverted clock signal CLKB is brought into a high level, the circuit nodes N1 and N2 are precharged to the ground potential VSS and the first amplifier circuit A1 is deactivated.

Transistors 203 to 206 constitute a flip-flop circuit F. That is, the transistors 203 and 205 are connected in series between the power supply terminal 25V supplied with the power supply potential VDD and a circuit node N11, and gate electrodes thereof are connected in common to drains of the transistors 204 and 206. The transistors 204 and 206 are connected in series between the power supply terminal 25V supplied with the power supply potential VDD and a circuit node N12, and gate electrodes thereof are connected in common to drains of the transistors 203 and 205. The internal write data WD0T is output from the drains of the transistors 203 and 205. The internal write data WD0B is output from the drains of the transistors 204 and 206. Internal write data WD0T/B is precharged by the transistors 213 and 214 to the power supply potential VDD when the clock signal CLK is brought into a low level.

Figure 1:
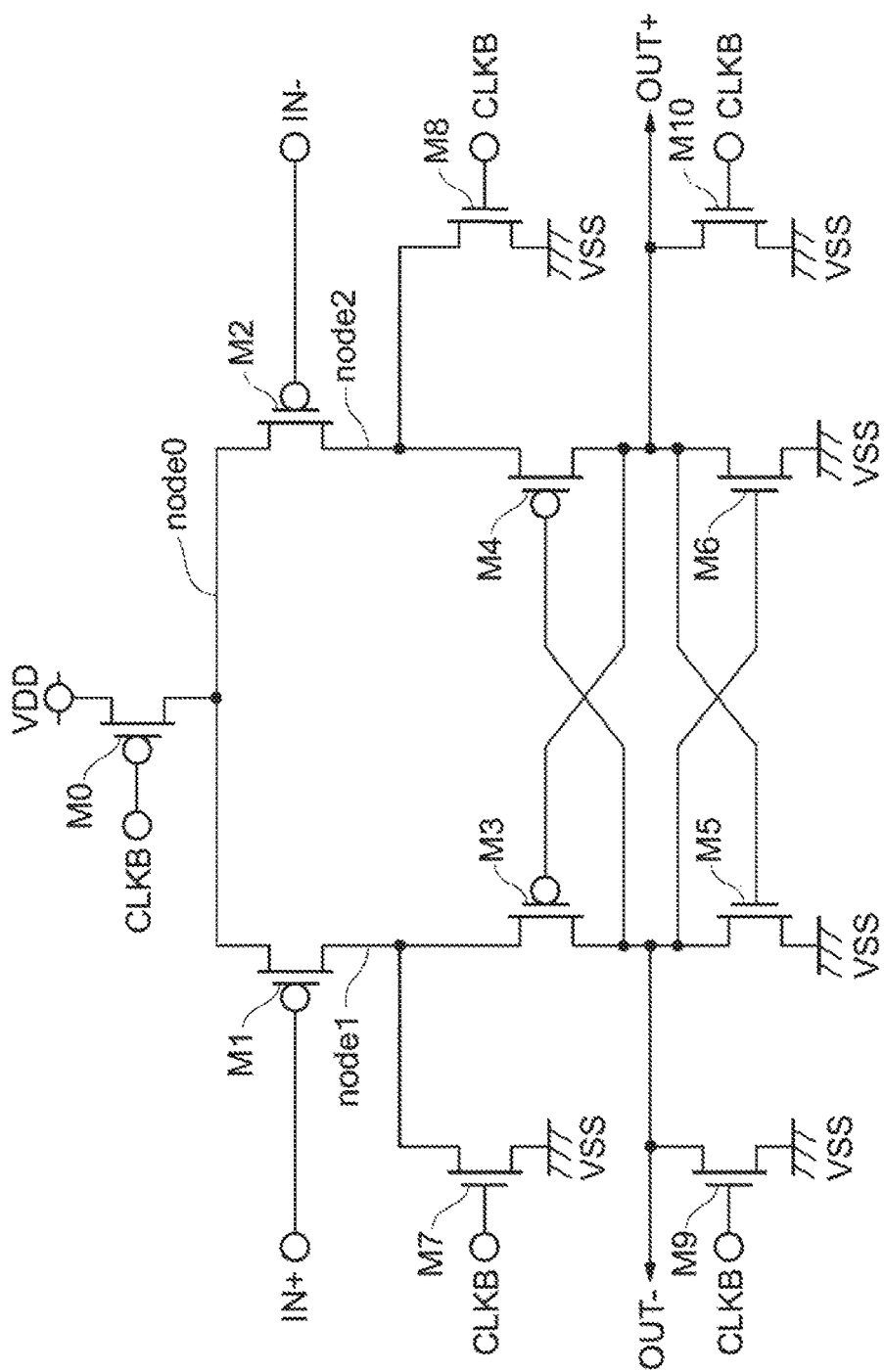
FIG. 1 is a circuit diagram of a conventional data input buffer circuit.
Figure 2:
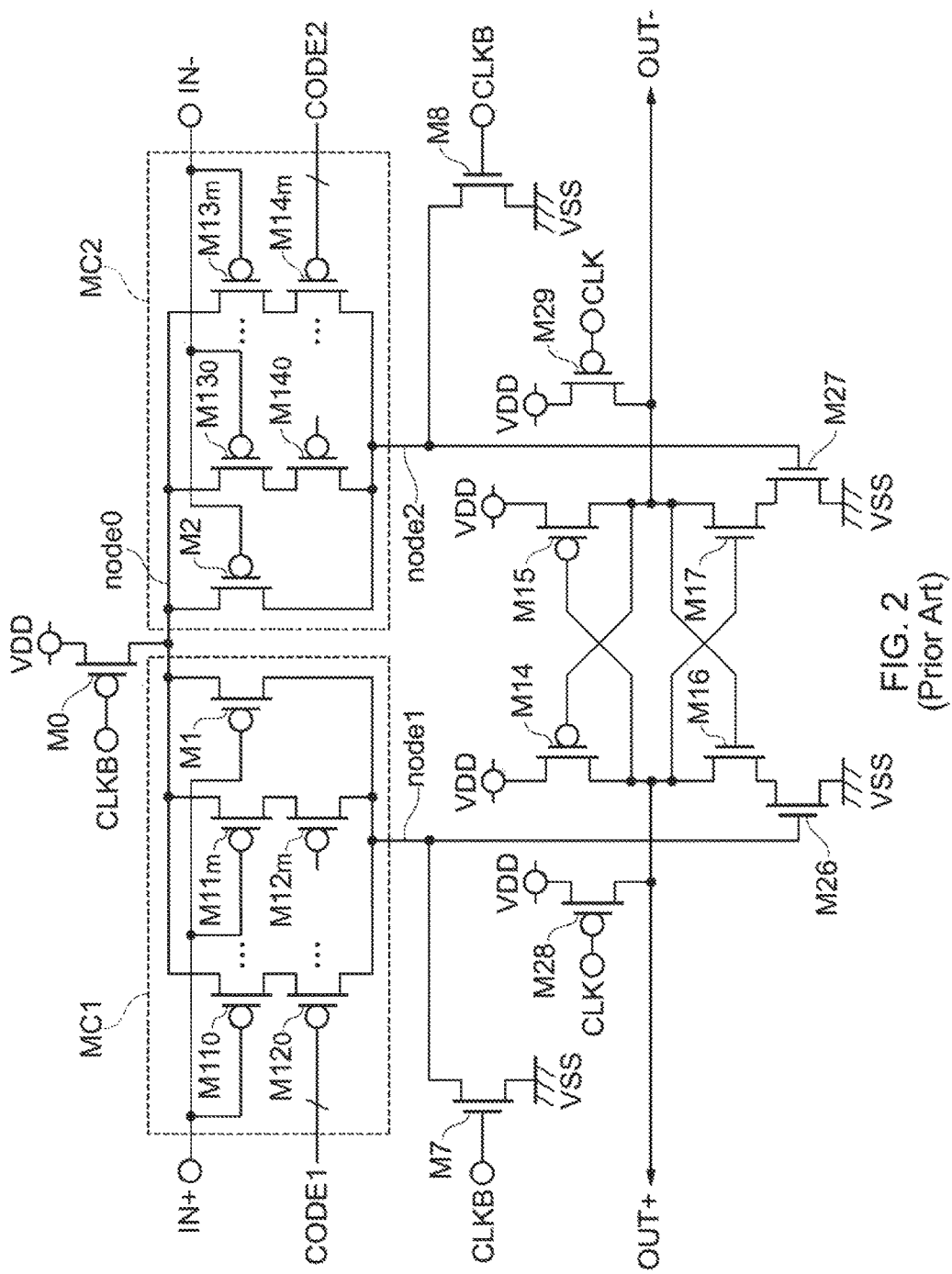
FIG. 2 is a circuit diagram of another conventional data input buffer circuit.

A transistor 207 is connected between the circuit node N11 and a circuit node N13. The gate electrode of the transistor 207 is connected to the circuit node N1. The circuit node N13 is connected to the power supply terminal 25S supplied with the ground potential VSS via the current control circuit CC1. A transistor 208 is connected between the circuit node N12 and a circuit node N14. The gate electrode of the transistor 208 is connected to the circuit node N2. The circuit node N14 is connected to the power supply terminal 25S supplied with the ground potential VSS via the current control circuit CC2. Accordingly, the transistors 207 and 208 constitute a second amplifier circuit A2 that supplies operation current to the flip-flop circuit F based on potentials of the circuit nodes N1 and N2. Capacitance components added to the circuit node N1 are only a gate capacitor of the transistor 207 and a drain capacitor of the transistor 211 and thus a capacitance value of the circuit node N1 is smaller than that of the node1 shown in FIGS. 1 and 2. Similarly capacitance components added to the circuit node N2 are only a gate capacitor of the transistor 208 and a drain capacitor of the transistor 212 and thus a capacitance value of the circuit node N2 is smaller than that of the node2 shown FIGS. 1 and 2. Therefore, a faster operation than the data input buffer circuit shown in FIGS. 1 and 2 can be realized.

The current control circuit CC1 includes transistors 310 to 31m connected in parallel between the circuit node N13 and the power supply terminal 25S supplied with the ground potential VSS. While the power supply potential VDD is fixedly applied to a gate electrode of the transistor 310, corresponding bits of the code signal CODE0T are supplied to gate electrodes of other transistors 311 to 31m, respectively. Sizes of the transistors 311 to 31m correspond to weights of the corresponding bits constituting the code signal CODE0T, respectively. For example, in a case where m=5 and when the transistor 311 corresponds to a LSB of the code signal CODE0T and the transistor 315 corresponds to a MSB of the code signal CODE0T, the transistor 312 has a size twice as large as that of the transistor 311, the transistor 313 has a size four times as large as that of the transistor 311, the transistor 314 has a size eight times as large as that of the transistor 311, and the transistor 315 has a size 16 times as large as that of the transistor 311.

The current control circuit CC2 includes transistors 320 to 32m connected in parallel between the circuit node N14 and the power supply terminal 25S supplied with the ground potential VSS. While the power supply potential VDD is fixedly applied to a gate electrode of the transistor 320, corresponding bits of the code signal CODE0B are supplied to gate electrodes of other transistors 321 to 32m, respectively. The transistors 321 to 32m have sizes corresponding to weights of the corresponding bits constituting the code signal CODE0B and have same transistor sizes as those of the transistors 311 to 31m, respectively.

This enables the amount of current flowing through the transistors 203, 205, and 207 to be adjusted based on the code signal CODE0T. Similarly, the amount of current flowing through the transistors 204, 206, and 208 can be adjusted based on the code signal CODE0B. Therefore, when an input offset is included in the DQ0 input circuit 100, the input offset can be cancelled by adjusting the amounts of current flowing through the current control circuits CC1 and CC2 based on the code signals CODE0T and CODE0B, respectively. The input offset is mainly caused by a difference in the threshold voltage between the transistor 201 and the transistor 202 due to process variation. The input offset may be also caused by a difference in the threshold voltage between the transistor 203 and the transistor 204, a difference in the threshold voltage between the transistor 205 and the transistor 206, or a difference in the threshold voltage between the transistor 207 and the transistor 208.

A sequence of amplification and latch operation may be executed, when the inverted clock signal CLKB is set to a logic low level that activates the transistor 200, and that deactivates the transistors 211 and 212. Simultaneously, a clock signal CLK is set to a logic high level that deactivates transistors 213 and 214. The power supply voltage VDD is provided to circuit nodes N1 and N2 through the transistors 201 and 202, and voltages of the circuit nodes N1 and N2 are increased from a precharge level VSS responsive to the inverted clock signal CLKB is at the logic low level, depending on the external write data DQ0. Thus, a voltage difference Vdiff between the circuit nodes N1 and N2 may be caused based on a difference between a voltage of the external write data DQ0 and the reference voltage VREF. The voltages of the circuit nodes N1 and N2 may exceed the threshold voltage VTh of the transistor 207 or the threshold voltage VTh of the transistor 208. Because the transistors 201 and 202 may activate the transistors 207 and 208 by driving gate capacitors of the transistors 207 and 208 respectively, the voltages of the circuit nodes N1 and N2 may increase quickly after the inverted clock signal CLKB is set to the logic low level. Thus, the amplifier A2 may complete the sequence of amplification and latch operation by the activation of the transistors 207 and 208, when the voltage of the circuit node N1 or the voltage of the circuit node N2 exceeds the threshold voltage VTh of the transistor 207 or the threshold voltage VTh of the transistor 208, respectively. Thus, the amplifier A2 may start the sequence of amplification and latch operation regardless of the voltage of the external write data DQ and the reference voltage VREF. In the precharge operation, the internal write data WD0T and WD0B may be fixed to the power supply voltage VDD by the transistors 213 and 214.

The values of the code signals CODE0T and CODE0B are written in the fuse circuit 40 during a wafer test conducted at the time of manufacturing of the semiconductor device 10. In the wafer test, the code signal CODE can be input to the semiconductor device 10 directly from outside. Furthermore, the reference voltage VREF can be supplied to both the gate electrode of the transistor 201 and the gate electrode of the transistor 202 in the wafer test. First, in a state where the reference voltage VREF is supplied to both the gate electrode of the transistor 201 and the gate electrode of the transistor 202, the code signal CODE0T is set to the maximum value (11111) and the code signal CODE0B is set to the minimum value (00000) as shown at step S1 in FIG. 7. Then, as shown at step S2, the code signal CODE0B is incremented to the maximum value (11111) and whether the internal write data WD0T/B has been inverted during this increment is determined. When the internal write data WD0T/B has been inverted during this increment, the value of the code signal CODE0T is settled to the maximum value (11111) and the value of the code signal CODE0B is settled to a value at a time of inversion of the internal write data WD0T/B.

Figure 7:
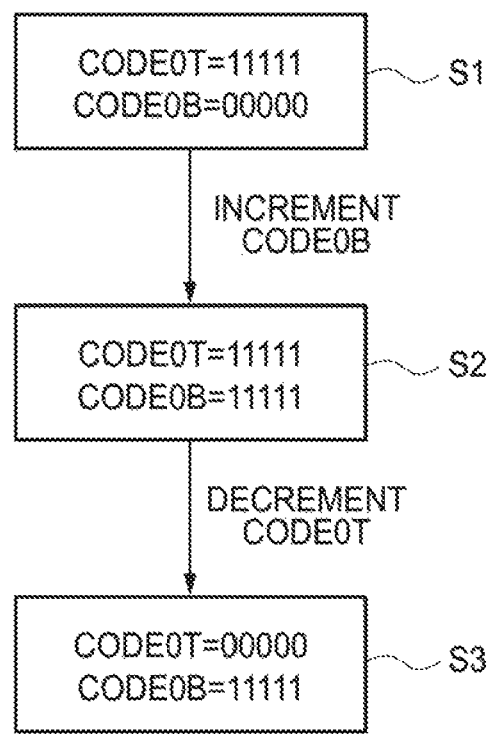
FIG. 7 is a flowchart for explaining how to determine the code signal.

Next, the code signals CODE0T and CODE0B are both set to the maximum value (11111), then the code signal CODE0T is decremented to the minimum value (00000) as shown at step S3 in FIG. 7, and whether the internal write data WD0T/B has been inverted during this decrement is determined. When the internal write data WD0T/B has been inverted during this decrement the value of the code signal CODE0B is settled to the maximum value (11111) and the value of the code signal CODE0T is settled to a value at a time of inversion of the internal write data WD0T/B.

Also for other code signals CODE1T/B to CODEnT/B, an identical test is conducted to the DQ0 input circuit 101 to the DQn input circuit 10n to settle respective values. The values of the code signals CODE0T/B to CODEnT/B settled in this way are written in the fuse circuit 40 during a wafer test. The code signals CODE0T/B to CODEnT/B written in the fuse circuit 40 are read each time the semiconductor device 10 is powered on, and are supplied to the DQ0 input circuit 100 to the DQn input circuit 10n corresponding thereto, respectively. In this way, each of the DQ0 input circuit 100 to the DQn input circuit 10n is enabled to operate in a state where an input offset is cancelled.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above,

The invention claimed is:

1. An apparatus comprising:
first and second voltage terminals;
first, second, and third circuit nodes, a potential of the first circuit node being changed based on an input signal;

a flip-flop circuit comprising first and second inverters cross-coupled to each other, the first inverter being coupled between the first voltage terminal and the second circuit node;

a first transistor coupled between the second and third circuit nodes, the first transistor having a control electrode coupled to the first circuit node; and a first current control circuit coupled between the third circuit node and the second voltage terminal, an amount of current flowing through the first current control circuit being controlled based on a first code signal.

2. The apparatus of claim 1, further comprising:
a fourth circuit node; and
a second transistor coupled between the fourth circuit node and the first circuit node,
wherein the second transistor having a control electrode supplied with the input signal.

3. The apparatus of claim 2, further comprising a third transistor coupled between the first voltage terminal and the fourth circuit node,
wherein the third transistor is brought into an ON state when a timing signal is in an active state.

4. The apparatus of claim 3, wherein the first circuit node is connected to the second voltage terminal when the timing signal is in an inactive state.

5. The apparatus of claim 3, further comprising:
fifth, sixth, seventh circuit nodes;
a fourth transistor coupled between the sixth and seventh circuit nodes, the fourth transistor having a control electrode coupled to the fifth circuit node; and
a second current control circuit coupled between the seventh circuit node and the second voltage terminal, an amount of current flowing through the second current control circuit being controlled based on a second code signal,
wherein the second inverter being coupled between the first voltage terminal and the sixth circuit node.

6. The apparatus of claim 5, further comprising a fifth transistor coupled between the fourth circuit node and the fifth circuit node.

7. The apparatus of claim 6, wherein the fifth transistor having a control electrode supplied with a reference voltage.

8. The apparatus of claim 6, wherein the fifth circuit node is connected to the second voltage terminal when the timing signal is in an inactive state.

9. The apparatus of claim 5, wherein the amount of current flowing through the first current control circuit is different from the amount of current flowing through the second current control circuit.

10. The apparatus of claim 5, further comprising a fuse circuit storing the first and second code signals.

11. The apparatus of claim 5,
wherein the first current control circuit comprises a plurality of sixth transistors coupled in parallel, and
wherein the second current control circuit comprises a plurality of seventh transistors coupled in parallel.

12. The apparatus of claim 11,
wherein at least two of the sixth transistors have different size from each other, and
wherein at least two of the seventh transistors have different size from each other.

13. The apparatus of claim 11,
wherein at least one of the sixth transistors is fixed to an ON state regardless of the first code signal, and
wherein at least one of the seventh transistors is fixed to an ON state regardless of the second code signal.

14. The apparatus of claim 11, wherein all the sixth transistors or all the seventh transistors are in an ON state.

15. An apparatus comprising:
first and second voltage terminals;
first, second, third, and fourth circuit nodes;
a flip-flop circuit comprising first and second inverters cross-coupled to each other, the first inverter being coupled between the first voltage terminal and the first circuit node, the second inverter being coupled between the first voltage terminal and the third circuit node;
a first transistor coupled between the first and second circuit nodes;
a second transistor coupled between the third and fourth circuit nodes;
a plurality of third transistors coupled in parallel between the second circuit node and the second voltage terminal; and
a plurality of fourth transistors coupled in parallel between the fourth circuit node and the second voltage terminal.

16. The apparatus of claim 15, wherein the plurality of third transistors are supplied with a first logic level in common to control electrodes thereof.

17. The apparatus of claim 16,
wherein one or more of the plurality of fourth transistors are supplied with the first logic level in common to control electrodes thereof, and
wherein remaining one or more of the plurality of fourth transistors are supplied with a second logic level in common to control electrodes thereof.

18. An apparatus comprising:
a first amplifier configured to generate first and second voltages by amplifying an input signal;
a third transistor configured to generate a third voltage by amplifying the first voltage;
a fourth transistor configured to generate a fourth voltage by amplifying the second voltage;
a latch circuit configured to latch a data indicated by a difference between the third and fourth voltages;
a first current control circuit configured to adjust a source current flowing through the third transistor; and
a second current control circuit configured to adjust a source current flowing through the fourth transistor.

19. The apparatus of claim 18,
wherein the first amplifier comprises a first transistor configured to receive the input signal to a control electrode thereof and a second transistor configured to receive a reference voltage,
wherein the first voltage is generated by the first transistor, and
wherein the second voltage is generated by the second transistor.

20. The apparatus of claim 19,
wherein the third transistor is coupled between the latch circuit and the first current control circuit, the third transistor being configured to receive the first voltage to a control electrode thereof, and
wherein the fourth transistor is coupled between the latch circuit and the second current control circuit, the fourth transistor being configured to receive the second voltage to a control electrode thereof.

21. An apparatus comprising:
first and second voltage terminals;
a first transistor coupled between the first voltage terminal and a first circuit node, the first transistor comprising a control gate configured to receive an input signal;

a second transistor coupled between the first voltage terminal and a second circuit node, the second transistor comprising a control gate coupled to the first circuit node;

a third transistor coupled between the second circuit node and the second voltage terminal, the third transistor comprising a control gate configured to receive a code signal;

a fourth transistor coupled between the first voltage terminal and a third circuit node, the fourth transistor comprising a control gate configured to receive a second input signal;

a fifth transistor coupled between the first voltage terminal and a fourth circuit node, the fifth transistor comprising a control gate configured to be coupled to the third circuit node: and a sixth transistor coupled between the fourth circuit node and the second voltage terminal, the sixth transistor comprising a control gate configured to receive a second code signal.

22. The apparatus of claim 21, further comprising:

a flip-flop circuit coupled among the first voltage terminal, the second transistor and the fifth transistor.

\* \* \* \* \*